(12) United States Patent
Farrow et al.

(10) Patent No.: US 7,621,143 B2
(45) Date of Patent: Nov. 24, 2009

(54) COOLING SYSTEMS

(75) Inventors: Timothy Samuel Farrow, Cary, NC (US); Albert Vincent Makley, Raleigh, NC (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 393 days.

(21) Appl. No.: 11/536,245

(22) Filed: Sep. 28, 2006

(65) Prior Publication Data

US 2008/0295534 A1    Dec. 4, 2008

(51) Int. Cl.
*F25D 23/12* (2006.01)

(52) U.S. Cl. .................................. 62/259.2; 62/511

(58) Field of Classification Search ............... 62/259.2, 62/505, 511; 361/688, 701; 165/80.4, 104.33
See application file for complete search history.

(56) References Cited

U.S. PATENT DOCUMENTS

| | | | |
|---|---|---|---|
| 2,112,890 A | 4/1938 | Gunn | |
| 3,203,182 A | 8/1965 | Pohl | |
| 3,884,600 A | 5/1975 | Gray | |
| 4,156,580 A | 5/1979 | Pohl | |
| 4,395,206 A | 7/1983 | Hoffmann | |
| 4,396,357 A | 8/1983 | Hartley | |
| 5,288,217 A | 2/1994 | Contiero | |
| 5,391,067 A | 2/1995 | Saunders | |
| 5,431,551 A | 7/1995 | Aquino | |
| 5,951,243 A * | 9/1999 | Cooper | 415/110 |
| 6,213,744 B1 | 4/2001 | Choroszylow | |
| 6,226,178 B1 * | 5/2001 | Broder et al. | 361/687 |
| 6,233,960 B1 * | 5/2001 | Kang et al. | 62/259.2 |
| 6,279,337 B1 * | 8/2001 | Davidson et al. | 62/259.2 |
| 6,490,877 B2 * | 12/2002 | Bash et al. | 62/200 |
| 6,520,754 B2 | 2/2003 | Randolphi | |
| 6,628,520 B2 * | 9/2003 | Patel et al. | 361/696 |
| 6,676,385 B1 | 1/2004 | Choroszylow | |
| 2002/0110466 A1 | 8/2002 | Randolphu | |
| 2005/0271535 A1 | 12/2005 | Katz | |

* cited by examiner

*Primary Examiner*—Melvin Jones
(74) *Attorney, Agent, or Firm*—Patrick J. Daugherty; Driggs, Hogg, Daugherty & Del Zoppo Co., LPA

(57) ABSTRACT

A self contained cooling system which is amenable to miniaturization so as to accommodate space and connectivity restrictions implicit in computer and other electronics apparatus while enhancing heat transfer. In use, the cooling systems of this invention use compression/expansion cycles of a refrigerant material to move thermal energy from one location to another. The compressor, condenser, and evaporator are all contained within a volume consistent with mounting directly on a semiconductor device such as a processor.

14 Claims, 5 Drawing Sheets

COOLING SYSTEMS

FIELD AND BACKGROUND OF INVENTION

This invention relates to cooling systems, and more particularly to systems which use compression/expansion cycles of a refrigerant material to move thermal energy from one location to another. The compression/expansion cycle is also known as the Carnot cycle and is familiar to physicists and mechanical engineers.

The cooling systems of this invention use a distinctive compressor/condenser/evaporator structure which is adapted to miniaturization and facilitates the application of the technology to small spaces such as in electronic apparatus. It is known that electronic apparatus which employ semiconductor devices using significant energy require cooling systems. Such electronic apparatus include computer systems. Such systems may be in the classes of personal computers such as desktop or notebook systems, in server systems, in mid- and main-frame systems and numerous other types of apparatus. In computer systems, very large scale integrated semiconductor devices such as processors have come to use many watts of energy and for that reason release significant heat loads. Those heat loads have heretofore been borne, in order to keep the temperature of processors in a reasonable operating range, by heat sinks with natural or forced convection air systems with or without fans, by heat pipes used in association with convection air systems, by circulated fluids such as water chilled by an external refrigeration system, and by other means. While these approaches have been operable and enabled use of the supported processors, increasing power and heat dissipation from semiconductor devices has imposed limits on development, particularly for physically smaller apparatus where space and connectivity capabilities are restricted.

SUMMARY OF THE INVENTION

With the foregoing in mind, the present invention contemplates a self contained cooling system which is amenable to miniaturization so as to accommodate space and connectivity restrictions implicit in computer and other electronic apparatus while enhancing heat transfer. In use, the cooling systems of this invention use compression/expansion cycles of a refrigerant material to move thermal energy from one location to another. The compression/expansion cycle is also known as the Carnot cycle and is familiar to physicists and mechanical engineers. The compressor, condenser, and evaporator are all contained within a volume consistent with mounting directly on a semiconductor device such as a processor.

BRIEF DESCRIPTION OF DRAWINGS

Some of the purposes of the invention having been stated, others will appear as the description proceeds, when taken in connection with the accompanying drawings, in which.

DETAILED DESCRIPTION OF INVENTION

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results of the invention. Accordingly, the description which follows is to be understood as being a broad, teaching disclosure directed to persons of skill in the appropriate arts, and not as limiting upon the present invention.

Figure 1:
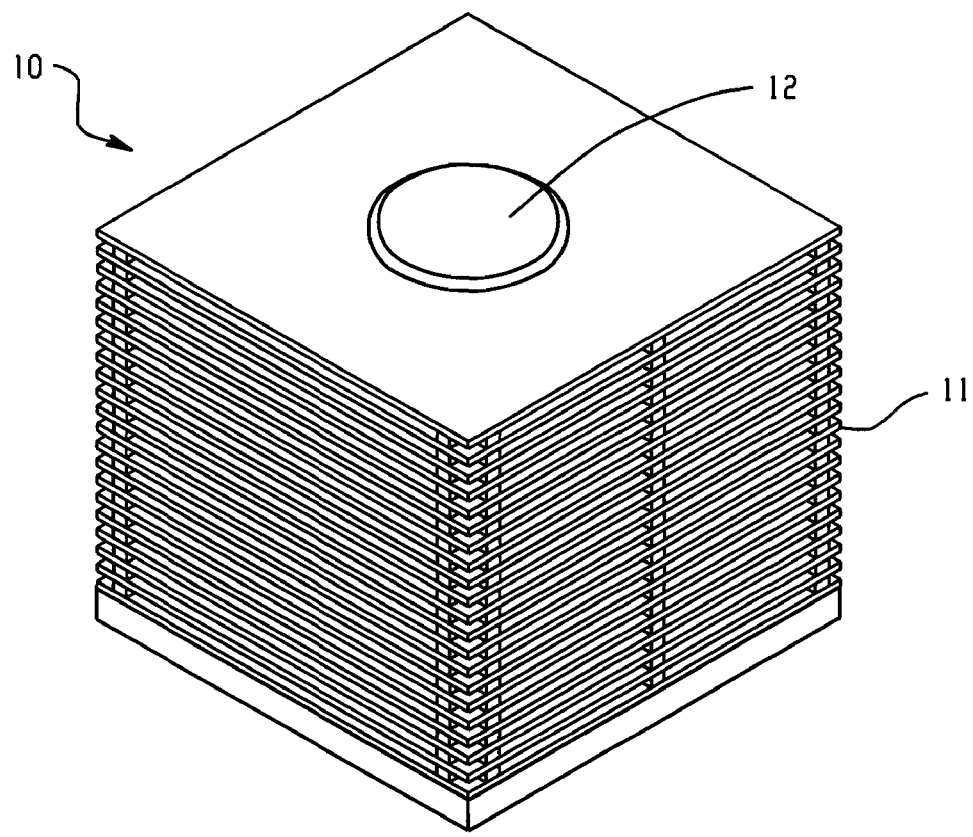
FIG. 1 is a perspective view of one embodiment of a cooling system in accordance with this invention.
Figure 2:
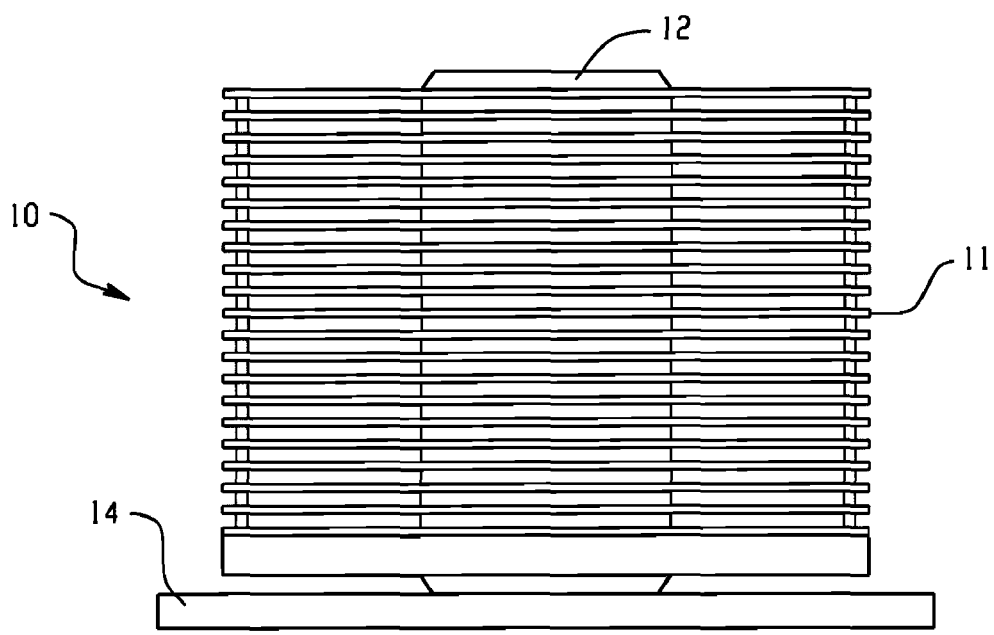
FIG. 2 is a side elevation view of the system of FIG. 1 as mounted on a heat generating semiconductor chip.

Referring now more particularly to the accompanying drawings, FIGS. 1 and 2 illustrate a cooling system 10 in accordance with this invention in which a self contained refrigeration device 11 is mounted within a heat sink 12 which accommodates transfer of heat to air by natural or forced convection. The refrigeration device, when mounted for use, contacts a surface of a semiconductor chip 14, and is mounted adjacent to and in heat transfer relation to the chip. As will become more clear from the discussion which follows, the self contained refrigeration component cools the chip, drawing heat from the chip, and transfers that heat to the heat sink for dispersal to air. This positive or impelled heat transfer is much more effective in maintaining desirable temperatures for the chip 14 than have been the prior art solutions such as the exclusive use of heat conducting grease or the like between a chip and a heat sink. Such a heat transfer assisting material may be of value in the present invention, however, and the present invention does not predispose or limit the use of thermal conducting grease or the like. The assembly is miniaturized to fit within the confines of a computer system such as that shown in FIG. 10.

As is the known common practice, the heat sink 12 is an array of fins formed of thin metal sheet and accommodating the mounting of a fan or the like, not shown in FIGS. 1 and 2.

Figure 3:
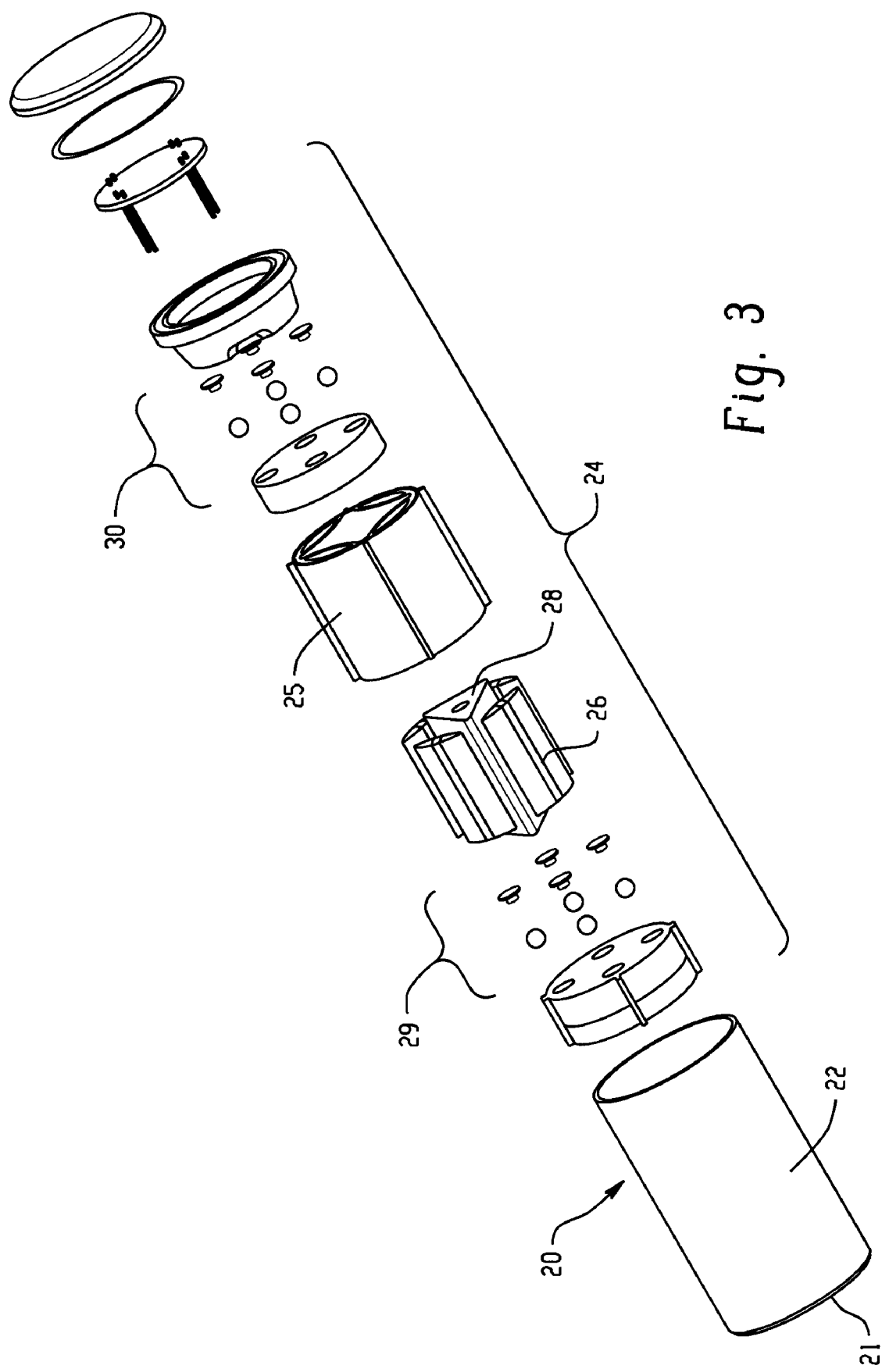
FIG. 3 is an exploded assembly view of the refrigeration system components of the cooling system of FIGS. 1 and 2.

FIG. 3 shows an exploded assembly view of the refrigeration component 11. The refrigeration component is an electro mechanical refrigeration device, operating on the Carnot cycle of expansion or evaporation of a fluid to absorb heat, compression of the expanded fluid, and condensation of the compressed fluid to transfer the absorbed heat. This cycle is familiar to persons skilled in the arts related to household or commercial refrigeration and air conditioning. Here, such a system has been significantly miniaturized and provided with a distinctive compressor functionality.

The refrigeration component is housed within an enclosure or can 20 which also provides evaporator and condenser surfaces for heat transfer. Within the can 20 are disposed an evaporator section 21, formed in the bottom of the can 20 for contact with a chip to be cooled, and a condenser section 22, formed in the cylindrical wall of the can 20 for contact with the encircling heat sink 11 (not shown in FIG. 3). Functioning with these sections is a compressor stage 24. One way to describe the refrigeration component would be to call it a heat pump in a can.

The compressor stage 24 has a housing 25 within which are mounted a plurality of electromagnetic coils 26A, 26B, 26C, 26D (see also FIGS. 4 through 8). The coils 26 drive in rotation a trilobal rotor 28, drawing a refrigerant fluid from the evaporator section 21 through a set of check valves 29 and discharging compressed refrigerant fluid into the condenser through another set of check valves 30.

The construction and operation of the compressor stage 24 will become more clear from consideration of FIGS. 4 through 8. As there shown in cross section views, the housing 25 defines an interior cavity which is four lobed. That is, there are four curved walls which together define a quadrilateral volume with convex inward walls. Within those walls is disposed the trilobal rotor or impeller 28. The check valves 29, 30 are disposed in the four corners of the interior cavity, with the low pressure or suction set 29 at the end of the housing which is inserted into the can 20 so as to be adjacent the evaporator section 21, and the high pressure or discharge set 30 at the opposite end so as to deliver pressurized refrigerant fluid into the condenser section 22. Viewing FIGS. 4 through 7 and considering the volume shown as being in the upper right hand corner of the Figures (to the right of the trilobal point marked with a small circle), as the rotor moves from the position of FIG. 4 to the position of FIG. 5, fluid contained in the volume is compressed and expelled through the discharge check valves 30. Then as the rotor rotates further, as shown by comparison of FIGS. 6 and 7, fluid is drawn into the volume through the suction check valves 29. The trilobal rotor moving within the quadrilateral volume thus defines four chambers which are cyclically expanding and contracting, pumping refrigerant fluid from the relatively low pressure of the evaporator to the relatively high pressure of the condenser.

The refrigerant fluid may be chosen from a number of available materials which transition liquid and gaseous phases under compression and expansion, and that specific choice forms no pertinent part of this invention. The choice is left to the skill of persons of knowledgeable in the relevant arts.

Figure 4:
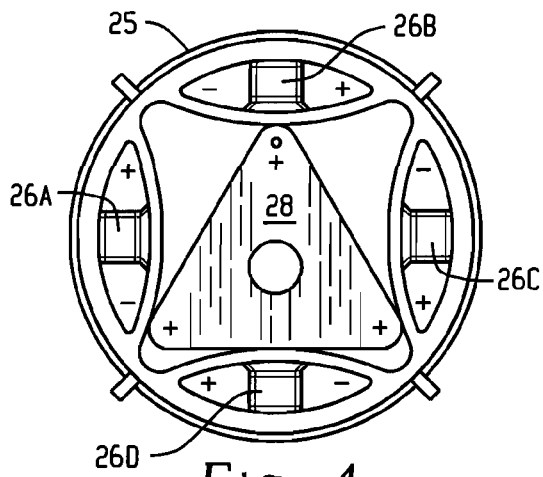
FIGS. 4 through 8 are a succession of plan views of elements of the assembly of FIG. 3, showing the rotational positions of a trilobal rotor forming a portion of the compressor of the cooling system.
Figure 5:
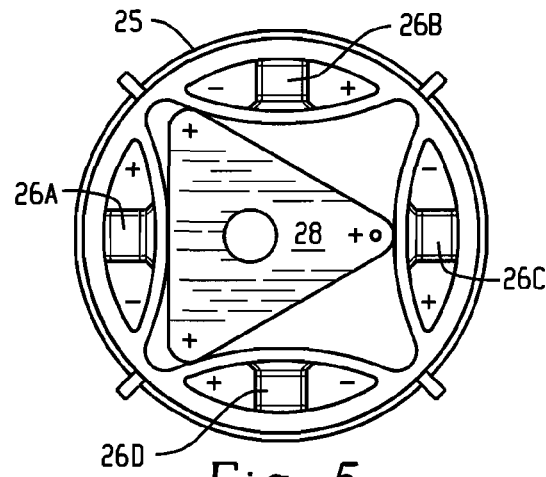
Figure 6:
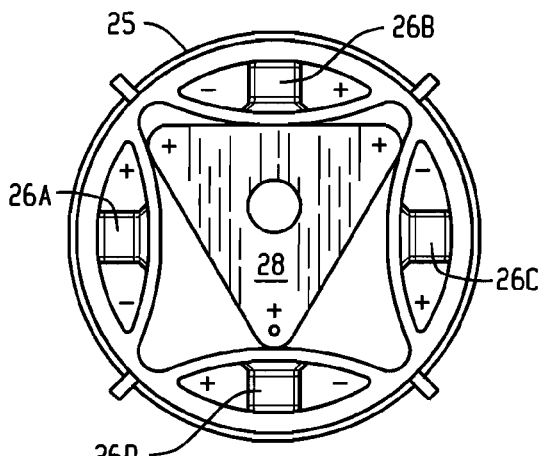
Figure 7:
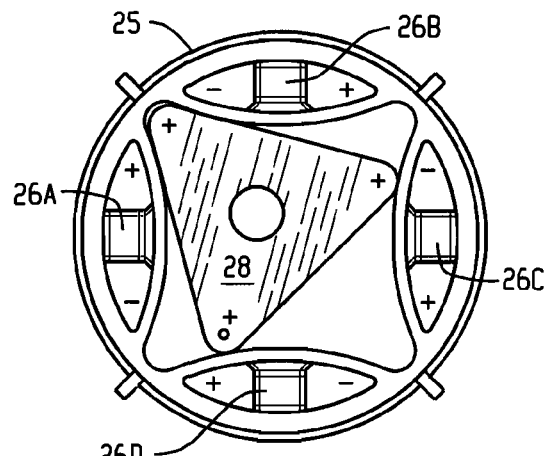
Figure 8:
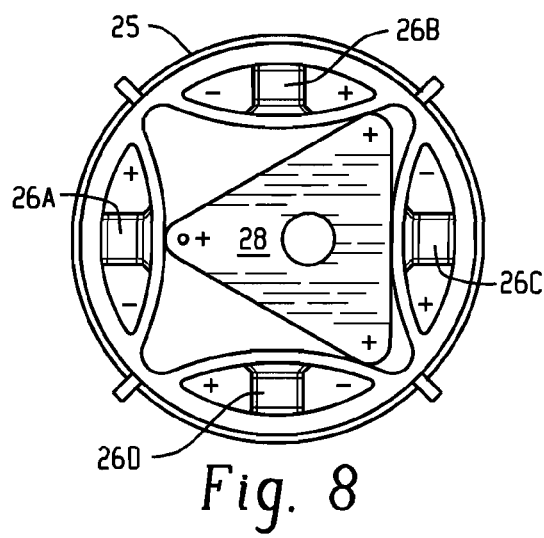

The trilobal rotor 28 preferably is made of a magneto ceramic material. With that choice, the impeller is driven in rotation by interaction with the electromagnetic coils 26. More particularly, the rotor 28 is formed to have a North magnetic pole (indicated in the drawings with a plus sign— "+") at each terminal of a lobe. The coils 26A, 26B, 26C, and 26D are wound to provide, when energized, a magnetic North pole ("+") to one side, in the direction in which the rotor will be driven, and a magnetic South pole ("−") to the other side. Rotation of the rotor 28 is driven by varying the energization of the coils in sequence. Referring to FIGS. 4, 5, 6 and 8, the sequence is as follows:

|        | FIG. 4 | FIG. 5 | FIG. 6 | FIG. 8 |
|--------|--------|--------|--------|--------|
| FIG. 4 | +      | −      | −      | −      |
| FIG. 5 | −      | +      | −      | −      |
| FIG. 6 | −      | −      | +      | −      |
| FIG. 8 | −      | −      | −      | +      |

In which the leftmost column defines the rotor position and the remaining columns identify current direction in the coils. As will be understood, the energization of the coils pulls the rotor into rotation. As the rotor rotates to the positions shown, the refrigerant fluid is drawn through the can and the self contained refrigeration device cools the chip.

While described with particular reference to the cooling of a semiconductor chip in a computer system, it will be understood that the compressor structure shown and described can find use in any refrigeration application.

Figure 9:
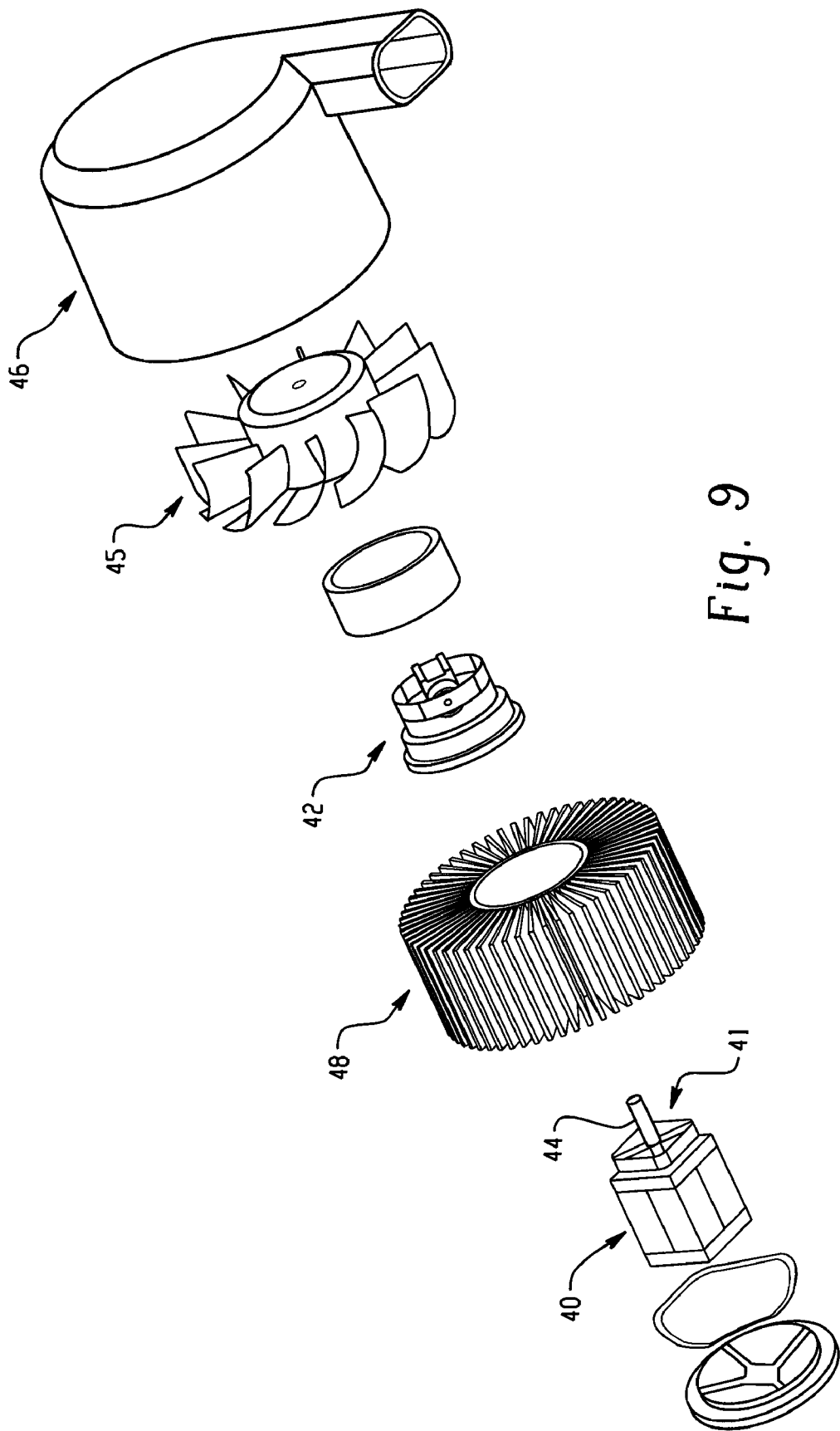
FIG. 9 is an exploded assembly view of a second embodiment of a cooling system in accordance with this invention.

In circumstances where a greater capacity might be desired for whatever reason, this invention contemplates that the compressor structure may be enhanced by the provision of a plurality of rotors working together. In particular, it is contemplated that such an array of rotors may be configured to that any vibration possibly induced by rotation of the rotors about an axis which is not centered within the housing (as is the case) is cancelled among a set of rotors. Where four rotors are coupled together by appropriate gearing, the phase relationship among the rotors accomplishes such vibration cancellation. Such an arrangement is illustrated in FIG. 9. There, the housing is indicated at 40 and the gearing at 41. The gearing is driven by an electrical motor indicated at 42 which is coupled to a drive shaft 44. The motor 42 also drives an air impeller 45 mounted within a scroll housing 46, which draws a flow of air across a heat sink 48 to release heat transferred through the action of the refrigeration unit. In other general respects, the apparatus of FIG. 9 is similar to the apparatus of the earlier figures.

Another variation which may enable enhanced heat transfer is to separate the condenser section from the can enclosing the evaporator and compressor. Where this is done, the condenser section may be located remotely from the evaporator and compressor and connected by suitable piping. This solution places the heat release or discharge portion of the refrigeration system where it may be more available to flow of air outside the computer case, in a computer application, facilitating reduction of in-case temperatures.

Figure 10:
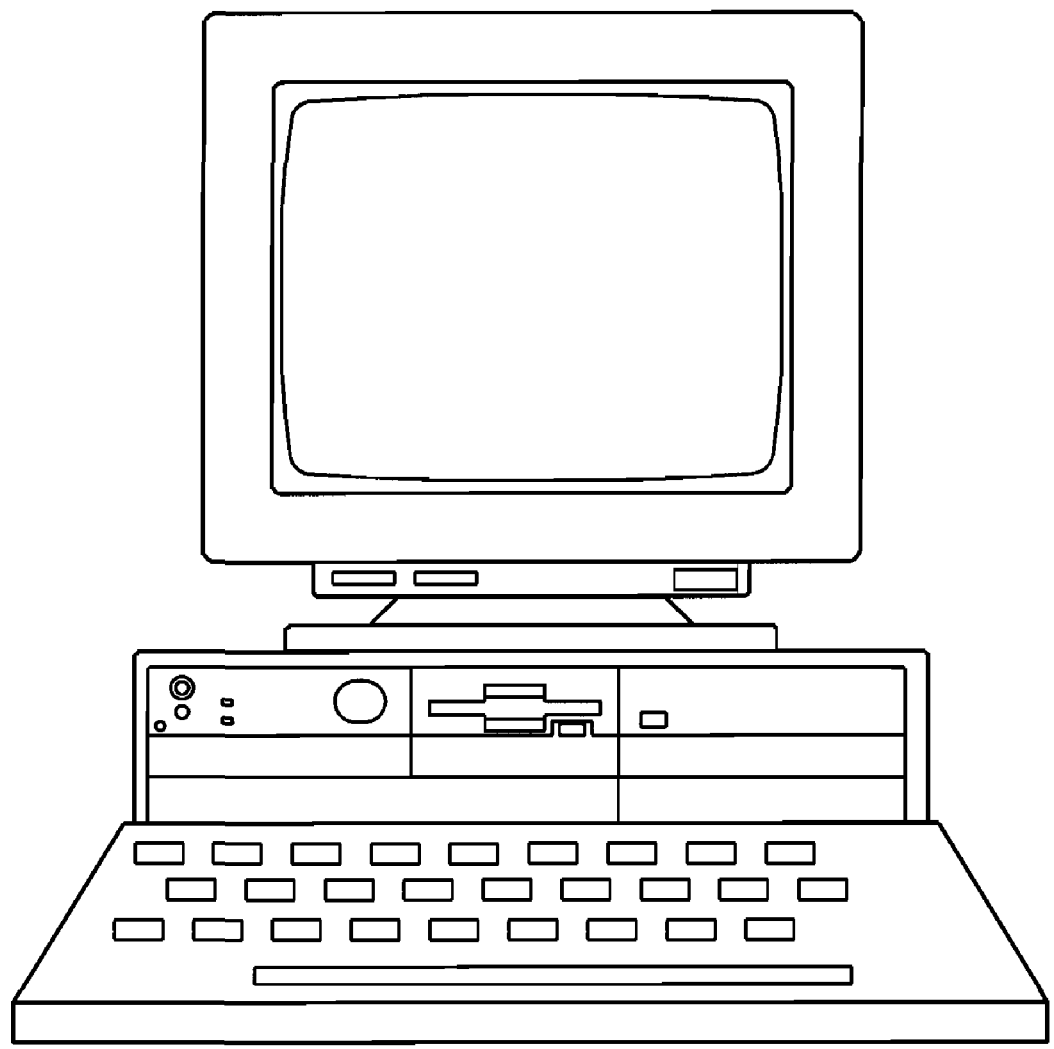
FIG. 10 is a representative illustration of a computer system in which the cooling system may be installed.

FIG. 10 is a representation of a computer system in which the self contained refrigeration device of this invention may be embedded. In the view, the apparatus is contained within the computer case and thus not visible.

In the drawings and specifications there has been set forth a preferred embodiment of the invention and, although specific terms are used, the description thus given uses terminology in a generic and descriptive sense only and not for purposes of limitation.

What is claimed is:

1. An apparatus, comprising:
a heat generating semiconductor chip; and
a self contained refrigeration device mounted adjacent to and in heat transfer relation to said chip; wherein the refrigeration device includes:
a compressor, and the compressor includes a housing, at least one trilobal impeller comprising a magneto ceramic body and mounted within said housing, and a plurality of electrically conductive coils interacting with said body;
an evaporator in heat transfer relation to said chip; and
a condenser;
wherein said evaporator, compressor and condenser are configured to conduct a flow of a refrigerant medium there amongst.

2. The apparatus according to claim 1 wherein said refrigeration device is a Carnot cycle refrigeration device.

3. The apparatus according to claim 1 wherein said refrigeration device is an electro mechanical refrigeration device.

4. The apparatus according to claim 1 further comprising a heat sink thermally coupled to said condenser.

5. The apparatus according to claim 4 further comprising an air handler operatively associated with said heat sink for impelling a flow of air across said heat sink.

6. The apparatus according to claim 1 wherein said at least one trilobal impeller comprises a plurality of trilobal impellers mounted within said housing, and a coupling joining said plurality of impellers together so that vibrational forces otherwise generated by rotation thereof are counterbalanced.

7. An apparatus, comprising:
a computer system; a heat generating semiconductor chip mounted in said computer system; and
a self contained refrigeration device mounted in said computer system adjacent to and in heat transfer relation to said chip; wherein the self contained refrigeration device includes:
a compressor, and the compressor includes a housing, at least one trilobal impeller comprising a magneto ceramic body and mounted within said housing, and a plurality of electrically conductive coils interacting with said body;
an evaporator in heat transfer relation to said chip; and
a condenser;
wherein said evaporator, compressor and condenser are configured to conduct a flow of a refrigerant medium there amongst.

8. The apparatus according to claim 7 wherein said refrigeration device is a Carnot cycle refrigeration device.

9. The apparatus according to claim 7 wherein said refrigeration device is an electro mechanical refrigeration device.

10. The apparatus according to claim 7 further comprising a heat sink thermally coupled to said condenser.

11. The apparatus according to claim 10 further comprising an air handler operatively associated with said heat sink for impelling a flow of air across said heat sink.

12. The apparatus according to claim 7 wherein said at least one trilobal impeller comprises a plurality of trilobal impellers mounted within said housing, and a coupling joining said plurality of impellers together so that vibrational forces otherwise generated by rotation thereof are counterbalanced.

13. An apparatus, comprising:
an evaporator element;
a condenser element; and
a compressor coupled with said evaporator and condenser for circulating a refrigerant material there amongst;
said compressor having an housing, a magneto ceramic trilobal rotor mounted within said housing, and a plurality of electromagnetic coils disposed about said rotor and magnetically coupled thereto.

14. An apparatus, comprising:
an evaporator element;
a condenser element; and
a compressor coupled with said evaporator and condenser for circulating a refrigerant material there amongst;
said compressor having an housing, a plurality of trilobal rotors mounted within said housing, and mechanism coupling said plurality of rotors together for coordinated rotation so that vibrational forces otherwise generated by rotation thereof are counterbalanced.

* * * * *

UNITED STATES PATENT AND TRADEMARK OFFICE
CERTIFICATE OF CORRECTION

PATENT NO. : 7,621,143 B2
APPLICATION NO. : 11/536245
DATED : November 24, 2009
INVENTOR(S) : Farrow et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 443 days.

Signed and Sealed this

Twenty-sixth Day of October, 2010

David J. Kappos
*Director of the United States Patent and Trademark Office*